United States Patent
Humphrey et al.

(10) Patent No.: US 10,809,301 B2
(45) Date of Patent: Oct. 20, 2020

(54) BELTED TRANSMISSION SYSTEM FOR LOAD MOTOR SYSTEM, HAVING SPROCKET THAT RECEIVES BELT COUPLED TO LOAD MOTOR

(71) Applicant: D&V Electronics, Ltd., Woodbridge (CA)

(72) Inventors: Philip Humphrey, Uxbridge (CA); William Clandfield, Toronto (CA)

(73) Assignee: D&V ELECTRONICS, LTD., Woodbridge (CA)

( * ) Notice: Subject to any disclaimer, the term of this patent is extended or adjusted under 35 U.S.C. 154(b) by 215 days.

(21) Appl. No.: 16/029,371

(22) Filed: Jul. 6, 2018

(65) Prior Publication Data

US 2020/0011930 A1    Jan. 9, 2020

(51) Int. Cl.
*F16H 7/02* (2006.01)
*G01R 31/34* (2020.01)

(52) U.S. Cl.
CPC .......... *G01R 31/343* (2013.01); *F16H 7/023* (2013.01)

(58) Field of Classification Search
CPC .... F16H 7/023; G01R 31/343; G01M 13/021; G01M 13/026; G01M 13/025; G01M 13/02
See application file for complete search history.

(56) References Cited

U.S. PATENT DOCUMENTS

| | | | | |
|---|---|---|---|---|
| 4,237,719 A | * | 12/1980 | Takano | G01M 13/023 73/114.77 |
| 4,520,659 A | * | 6/1985 | Lucia | G01M 13/025 73/115.02 |
| 4,898,026 A | * | 2/1990 | Damitz | G01M 13/026 73/115.01 |
| 5,537,865 A | * | 7/1996 | Shultz | G01M 13/02 73/115.02 |

(Continued)

FOREIGN PATENT DOCUMENTS

CN    103072474 A    5/2013

OTHER PUBLICATIONS

Automotive electric motor and inverter tester, EOL Expertise, accessed on Jul. 6, 2018 at https://www.eolexpertise.com/motor-inverter-eol-test-development/, pp. 1-2.

*Primary Examiner* — Brandi N Hopkins
(74) *Attorney, Agent, or Firm* — Pillsbury Winthrop Shaw Pittman LLP

(57) ABSTRACT

The present disclosure relates to a belted transmission system configured to couple with load motors to provide a load to a device under test. The belted transmission system comprises a spindle coupled with the device under test. The spindle comprises various components configured to facilitate high operational speeds and increased power relative to prior art systems. For example, the spindle comprises a shaft having a larger diameter at one end compared to the other, one or more bearings configured to facilitate rotation of the shaft, and a sprocket coupled to the shaft configured to (Continued)

receive belts coupled to load motors such that the shaft is driven by the one or more belts to turn the spindle and load the device under test. The belted transmission includes a housing configured to enclose the belts and at least a portion of the spindle.

20 Claims, 11 Drawing Sheets

(56) References Cited

U.S. PATENT DOCUMENTS

| | | | |
|---|---|---|---|
| 7,921,712 B1 * | 4/2011 | Rindler | G01M 13/02 73/116.05 |
| 8,844,344 B2 * | 9/2014 | Plowman | G01M 13/026 73/115.02 |
| 2013/0055858 A1 | 3/2013 | Richardson | |
| 2015/0115855 A1 * | 4/2015 | Naitou | G01R 31/343 318/467 |
| 2015/0180309 A1 | 6/2015 | Klemen et al. | |

* cited by examiner

BELTED TRANSMISSION SYSTEM FOR LOAD MOTOR SYSTEM, HAVING SPROCKET THAT RECEIVES BELT COUPLED TO LOAD MOTOR

BACKGROUND OF THE INVENTION

Field of the Invention

The present disclosure relates to a load motor system used in a test stand to provide a load to a device under test, and related methods.

Description of Related Art

The automotive industry uses test stands to validate electric motors and inverters used in both hybrid and fully electric vehicles. The power, speed, and torque of these electric and hybrid vehicle motors has been increasing. These improved electric and hybrid vehicle motors require more powerful and higher speed load systems to validate their performance. Current industrial electric motors are not capable of meeting engine loading performance requirements.

SUMMARY OF EMBODIMENTS OF THE INVENTION

One aspect of the present disclosure relates to a belted transmission system configured to couple with one or more load motors to provide a load to a device under test. The belted transmission system comprises a spindle having a first end configured to couple with the device under test and a second opposite end. The spindle comprises a shaft extending from the first end to the second end. The shaft has a larger diameter at the first end compared to the second end. The spindle comprises one or more bearings configured to facilitate rotation of the shaft. The spindle comprises a sprocket coupled to the shaft between the first end and the second end. The sprocket is configured to receive one or more belts coupled to the one or more load motors such that the shaft is driven by the one or more belts to turn the spindle and load the device under test. The belted transmission includes a housing configured to enclose the one or more belts and at least a portion of the spindle.

A second aspect of the present disclosure relates to a load motor system used in a test stand to provide a load to a device under test. The system comprises a first load motor configured to drive the device under test and a second load motor configured to drive the device under test. The system comprises a belted transmission configured to couple with the first and second load motors and provide the load to the device under test. The belted transmission comprises a spindle having a first end configured to couple with the device under test and a second opposite end. The spindle comprises a shaft extending from the first end to the second end. The shaft has a larger diameter at the first end compared to the second end. The system comprises a first belt configured to be received by the shaft and coupled to the first load motor. The system comprises a second belt configured to be received by the shaft and coupled to the second load motor such that the shaft is driven by the first and second belts to turn the spindle and load the device under test. The system comprises a housing configured to enclose the first belt, the second belt, and at least a portion of the spindle, and facilitate mounting of the belted transmission to the test stand.

In some embodiments, the one or more bearings comprise two bearings. A first bearing of the two bearings is coupled to the shaft toward the first end, and a second bearing of the two bearings is coupled to the shaft toward the second end. In some embodiments, the first bearing has a larger diameter than the second bearing.

In some embodiments, the shaft comprises labyrinth grooves formed in a circumference of the shaft located proximate to the one or more bearings. The grooves are configured to prevent or reduce contamination in the one or more bearings.

In some embodiments, the shaft comprises one or more cooling channels located proximate to the sprocket. The one or more cooling channels are configured to facilitate airflow that cools the shaft, the sprocket, and the one or more belts. In some embodiments, the one or more cooling channels are formed as depressions in the shaft around a circumference of the shaft.

In some embodiments, the shaft comprises a flange at the first end. The flange is configured to receive a torque sensor and facilitate coupling of the spindle with the device under test. In some embodiments, the one or more bearings are configured to couple with one or more corresponding temperature sensors. The one or more corresponding temperature sensors are configured to generate output signals conveying information related to temperatures of the one or more bearings. The information related to the temperatures of the one or more bearings may be used to determine whether the spindle is at risk of overheating.

In some embodiments, the system further comprises one or more lubrication jets located proximate to the one or more bearings. The one or more lubrication jets are configured to apply lubricant to the one or more bearings to cool the one or more bearings.

In some embodiments, the housing comprises a spindle housing and a belt housing. The spindle housing comprises two or more separable pieces configured to facilitate access to and adjustment of the spindle by a user. The belt housing comprises a serpentine air exhaust path configured to exhaust air from the system and absorb noise produced by the system.

A third aspect of the present disclosure relates to a method for providing a load to a device under test with a belted transmission system. As described above, the belted transmission system is configured to couple with one or more load motors. The belted transmission system comprises a spindle and a housing. The method comprises coupling a first end of the spindle with the device under test. The method comprises forming a shaft of the spindle with a larger diameter at a first end of the spindle relative to the second end. The method comprises facilitating rotation of the shaft with one or more bearings of the spindle. The method comprises coupling a sprocket to the shaft. The method comprises receiving, with the sprocket, one or more belts coupled to the one or more load motors such that the shaft is driven by the one or more belts to turn the spindle and load the device under test. The method comprises enclosing the one or more belts and at least a portion of the spindle with a housing of the belted transmission system.

In some embodiments, the one or more load motors comprise two load motors, and the method comprises receiving, with the sprocket, a first belt coupled to a first load motor of the two load motors, and a second belt coupled to a second load motor of the two load motors, and driving the shaft with the first belt and the second belt to turn the spindle and load the device under test.

In some embodiments, the method further comprises generating, with a torque sensor of the belted transmission system, output signals conveying information related to an amount of torque generated by the belted transmission system. In some embodiments, the method further comprising generating, with one or more temperature sensors of the belted transmission system, output signals conveying information related to temperatures of one or more bearings coupled to the shaft. The information related to temperatures of the one or more bearings may be used to determine whether the spindle is at risk of overheating. In some embodiments, the method further comprises loading the device under test without a gearbox.

These and other aspects of various embodiments of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. In one embodiment of the invention, the structural components illustrated herein are drawn to scale. It is to be expressly understood, however, that the drawings are for the purpose of illustration and description only and are not intended as a definition of the limits of the invention. In addition, it should be appreciated that structural features shown or described in any one embodiment herein can be used in other embodiments as well. As used in the specification and in the claims, the singular form of "a", "an", and "the" include plural referents unless the context clearly dictates otherwise.

All closed-ended (e.g., between A and B) and open-ended (greater than C) ranges of values disclosed herein explicitly include all ranges that fall within or nest within such ranges. For example, a disclosed range of 1-10 is understood as also disclosing, among other ranged, 2-10, 1-9, 3-9, etc.

BRIEF DESCRIPTION OF THE DRAWINGS

For a better understanding of embodiments of the present invention as well as other objects and further features thereof, reference is made to the following description which is to be used in conjunction with the accompanying drawings, where.

DETAILED DESCRIPTION OF EXEMPLARY EMBODIMENTS OF THE INVENTION

Figure 1:
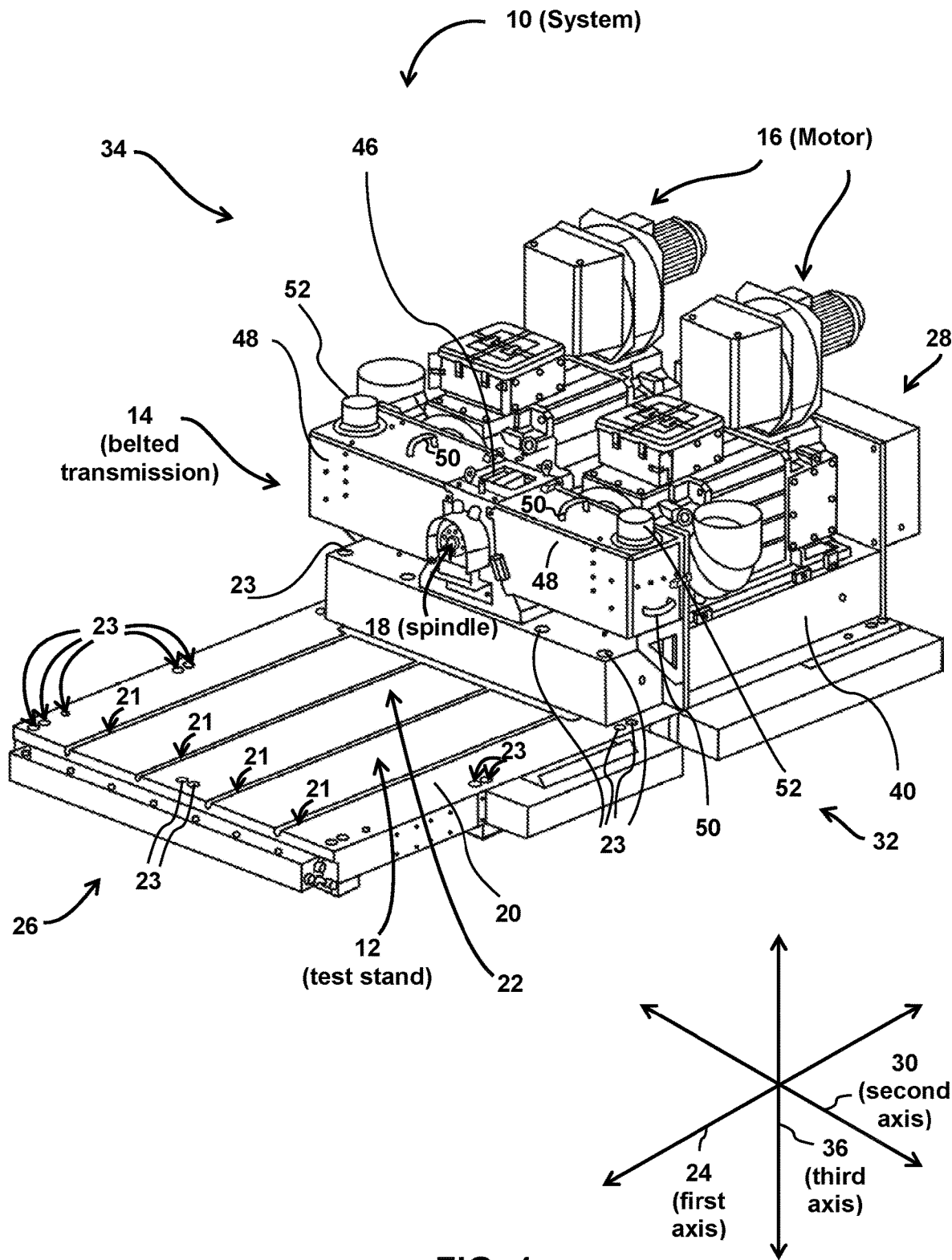
FIG. 1 illustrates a load motor system used in a test stand to provide a load to a device under test.

FIG. 1 illustrates a load motor system 10 used in a test stand 12 to provide a load to a device under test (not shown in FIG. 1). In the testing industry, the term used to define an article being evaluated is "DUT" (device under test). This term may generally refer to any device that is being tested (e.g., a motor, alternator, starter, battery, wheel, brakes, etc.). A device under test may include an electric motor, for example, or other devices. This example electric motor may be used in hybrid vehicles, fully electric vehicles, or other vehicles. Tests performed on a test stand may vary depending on the device being tested. In this example a test stand for an electric motor is used to validate the performance of the motor. This means that the motor will be run at various speeds and torques to evaluate the capabilities of the motor. System 10 includes a belted transmission 14 configured to couple with standard industrial motors 16. As described herein, system 10 may be useful in the automotive industry, but this is not intended to be limiting. System 10 may by useful in the aerospace industry, the off road industry, the power generation industry etc. System 10 may be used in any industry. Often, in prior art load motor systems used in test stands, two devices under test are coupled together, fighting one another. A drawback of this arrangement is that it is difficult if not impossible to test the peak loading capabilities of a particular motor, since it is often unclear whether one of the two motors may be limiting loading system performance.

System 10 may be configured to couple with and/or include standard industrial motors, but system 10 facilitates higher speed and higher power operation compared to prior art test stand load motor systems. As shown in the example embodiment illustrated in FIG. 1, system 10 may be configured to couple with one or two motors 16. Using two motors and belted transmission 14 (along with other features described herein) allows system 10 to produce the power required to load modern electric and hybrid vehicle motors and/or other devices, while using a speed up ratio, such that speeds of 20,000 RPM and above are possible, even in load systems of 300-500 kW.

In addition, system 10 may be configured to enhance the interchangeability of various system components relative to prior art systems. For example, system 10 may be configured such that users have easy physical access to a spindle 18 (described below) which may be removed, adjusted, swapped in or out, etc., by a user. The interchangeability of various components of system 10 provides functionality to a test stand (e.g., test stand 12) that is not provided in currently marketed systems, and facilitates testing of electric and/or hybrid vehicle motors with and without gearboxes on the same test stand. For example, the interchangeability of system 10 may provide varying speed versus torque characteristics without requiring a new test bed.

Among other advantages, these and other features facilitate the use of readily available industrial motors 16 with system 10. As described above, with the use of a belted transmission, system 10 is able to increase loading system speeds above what the market is currently able to provide. Also by providing system 10 with an interchangeable spindle (e.g., transmission), the flexibility of system 10 allows users to adjust speed versus torque curves of system 10 by simply changing the transmission. By combining two motors 16 in parallel, the power produced by system 10 may also be doubled, and thus more torque is available for testing relative to prior art systems. The design of system 10 overcomes several challenges faced during development: torque transmission at lower speeds (e.g., in system 10 the drive shaft diameter is sufficiently sized to withstand the high torques required during starts and high acceleration tests); transmission interchangeability (e.g., the design of system 10 allows for quick and easy transmission changes to modify ratios); noise at high speeds (e.g., the design of system 10 keeps noise from timing belt meshing at levels that do not generate excessive heat or an unsafe work environment); and heat at high speeds (e.g., the design of system 10 keeps heat from bearings and belts at levels that do not cause failures of system 10). It should be noted that system 10 does not include a gearbox. System 10 does not include a gearbox because torque pulsations and reversals required during testing of a device under test would prematurely wear any such gearbox.

Test stand 12 may be configured to couple with and/or otherwise support a device under test, belted transmission 14, motors 16, and/or other devices. Test stand 12 may include various structural components such as beams, plates, blocks, posts, planar and other surfaces, racks, shelves, pipes, cables, rails, struts, and/or other components configured to support such devices. Test stand 12 may include various features and/or components such as slots, orifices, clamps, clips, threaded holes, straps, screws, nuts, bolts, hooks, tensioning devices and/or other components configured to facilitate coupling one or more devices with test stand 12. In some embodiments, test stand 12 may be configured to remain in a stationary position. For example, test stand 12 may remain in a stationary position on a floor surface, or in other locations.

By way of a non-limiting example, FIG. 1 illustrates at least a portion of test stand 12 supporting belted transmission 14 and motors 16. In FIG. 1, dual motors 16 and belted transmission 14 are mounted on a T-slot bedplate 20 of test stand 12. Bedplate 20 has a substantially rectangular cross-section, extends along a first axis 24 of system 10 from a first side 26 to a second side 28, and extends along a second axis 30 of system 10 from a third side 32 to a fourth side 34. Bedplate 20 has a thickness that extends along a third axis 36 of system 10. Bedplate 20 may include multiple T-slots 21, threaded or unthreaded mounting holes 23, and other features that facilitate mounting components to bedplate 20. Bedplate 20 provides a space 22 for mounting a device under test (not shown in FIG. 1) proximate to belted transmission 14. In this example, test stand 12 includes a rectangular support block 40. Rectangular support block 40 is positioned between bedplate 20 and belted transmission 14 and motors 16 in FIG. 1, but this is not intended to be limiting. In some embodiments, the device under test may be coupled to system 10 with a dog bone splined coupling and/or other components, for example. The dimensions and orientation of the various features of test stand 12 may be determined based on the characteristics (e.g., size, shape, weight, movement, etc.) of components coupled to test stand 12 and/or on other factors. In short, the dimensions and features of, and components included in, test stand 12 may be any dimension, features, and components that allow system 10 to function as described herein.

Figure 2:
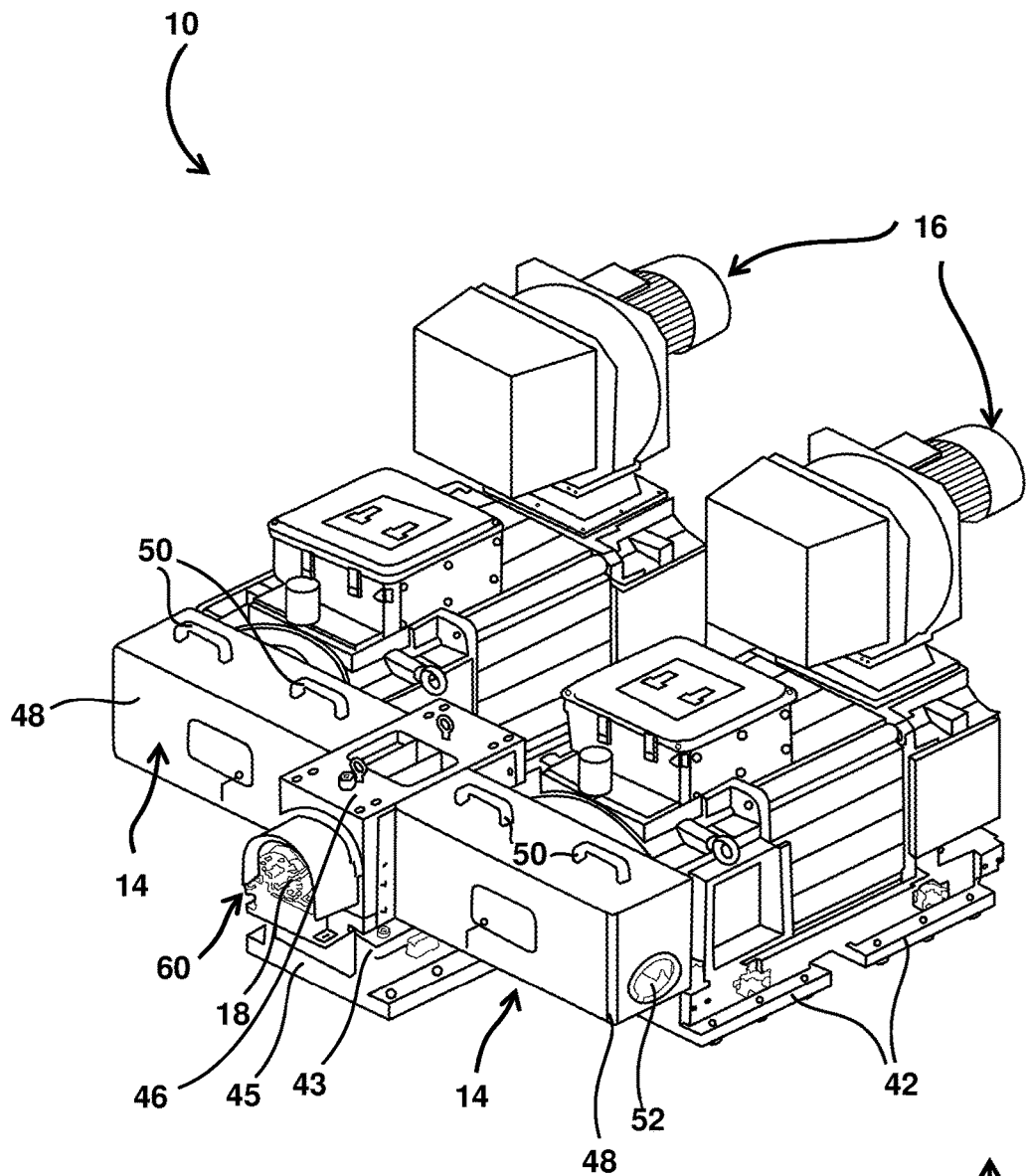
FIG. 2 illustrates belted transmission of the system coupled to two load motors.
Figure 2:
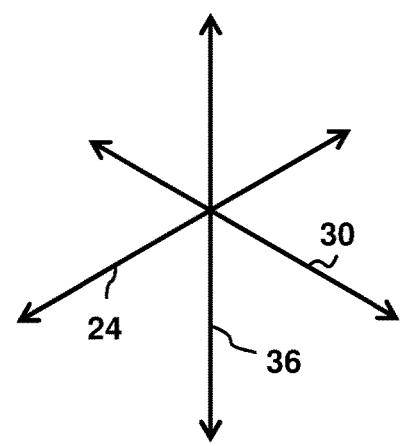
Figure 3:
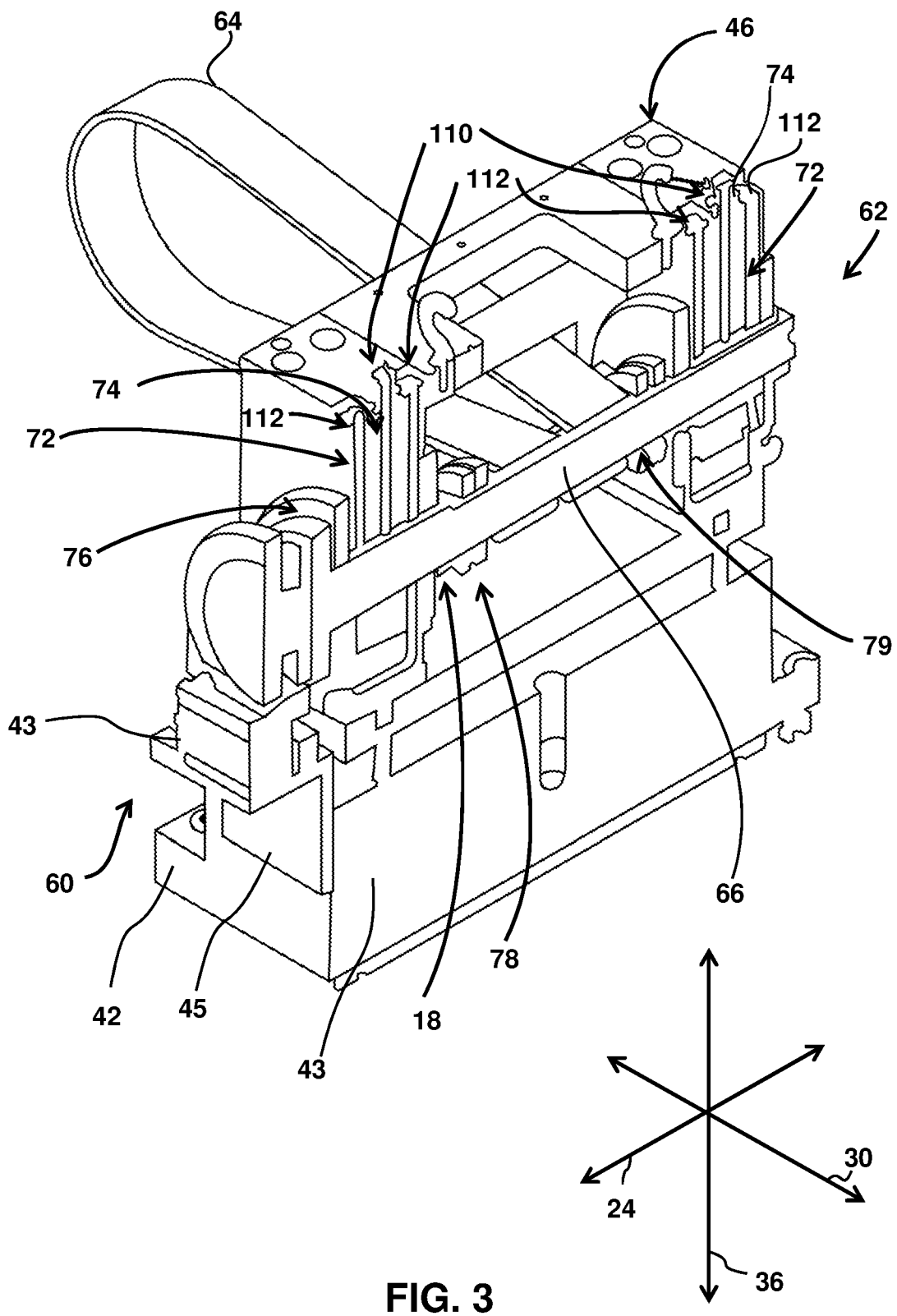
FIG. 3 illustrates a perspective cross sectional view of a spindle and a spindle housing of the system.

As described above, belted transmission 14 may be coupled to test stand 12. Belted transmission 14 may be configured to couple with one or more load motors 16 to provide a load to a device under test. FIG. 2 illustrates belted transmission 14 coupled to two load motors 16. As shown in FIG. 2, belted transmission 14 and load motors 16 may include or be configured to couple with various mounting plates 42, blocks 43, brackets 45, and/other components that facilitate mounting belted transmission 14 and/or load motors 16 to test stand 12 (not shown in FIG. 2). Load motors 16 are generally oriented along first axis 24. Belted transmission 14 may include spindle 18 and a spindle housing 46 generally oriented along first axis 24, belt housings 48 generally oriented along second axis 30, and/or other components. Load motors 16 are positioned proximate to belt housings 48 on either side of spindle 18 and spindle housing 46 along second axis 30. As shown in FIG. 1 and FIG. 2, belt housings 48 may include handles 50, exhaust ports 52, and/or other features on various surfaces of belt housings 48. (Belt housings 48 are described in greater detail below.) Handles 50 and exhaust ports 52 may be in various orientations A perspective cross sectional view of spindle 18 and spindle housing 46 is illustrated in FIG. 3. Spindle 18 may be configured to removably couple with a device under test. Spindle 18 may have a first end 60 configured to couple with the device under test and a second opposite end 62. Spindle 18 may be configured to couple with belts 64 (only one belt 64 is shown because of the cross sectional nature of FIG. 3), which in turn couple with motors 16 (not shown in FIG. 3). Various components of spindle 18 may be configured to facilitate higher power and higher speed operation of system 10 (FIG. 1) relative to prior art systems. For example, the spindle may comprise a shaft 66, a sprocket 67, bearings 68 and 70, one or more lubrication jets 72, one or more temperature sensors 74, a flange 76, one or more locking rings 78 and 79, and/or other components.

Figure 4:
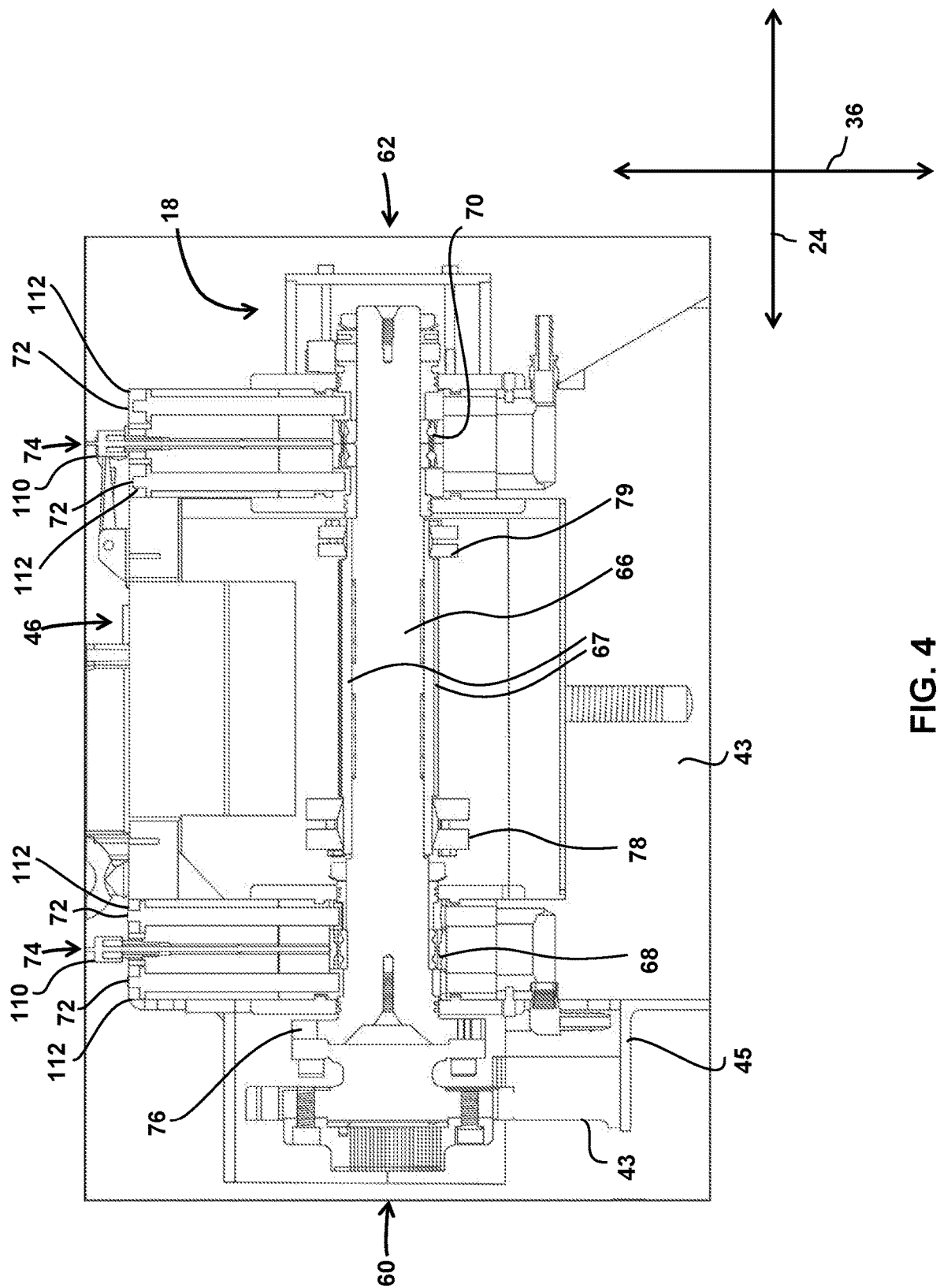
FIG. 4 illustrates a similar cross sectional view of the spindle and the spindle housing.

A similar cross sectional view of spindle 18 and spindle housing 46 is illustrated in FIG. 4. For example, FIG. 4 also illustrates shaft 66, sprocket 67, bearings 68 and 70, one or more lubrication jets 72, one or more temperature sensors 74, flange 76, locking rings 78 and 79, and/or other components. As shown in FIG. 4, shaft 66 extends along first axis 24. Flange 76 is located toward first end 60. A first bearing 68 is located proximate to flange 76 along shaft 66 toward second end 62. A first temperature sensor 74 is located at or near first bearing 68. Lubrication jets 72 are located on either side of first bearing 68 along shaft 66. A first locking ring 78 is located proximate to first bearing 68 along shaft 66 toward second end 62. Sprocket 67 is located between first locking ring 78 and a second locking ring 79. Second locking ring 79 is located toward second end 62 along shaft 66. A second bearing 70 is located proximate to second locking ring 79 along shaft 66 toward second end 62. A second temperature sensor 74 is located at or near second bearing 70. Lubrication jets 72 are located on either side of second bearing 70 along shaft 66.

Figure 5:
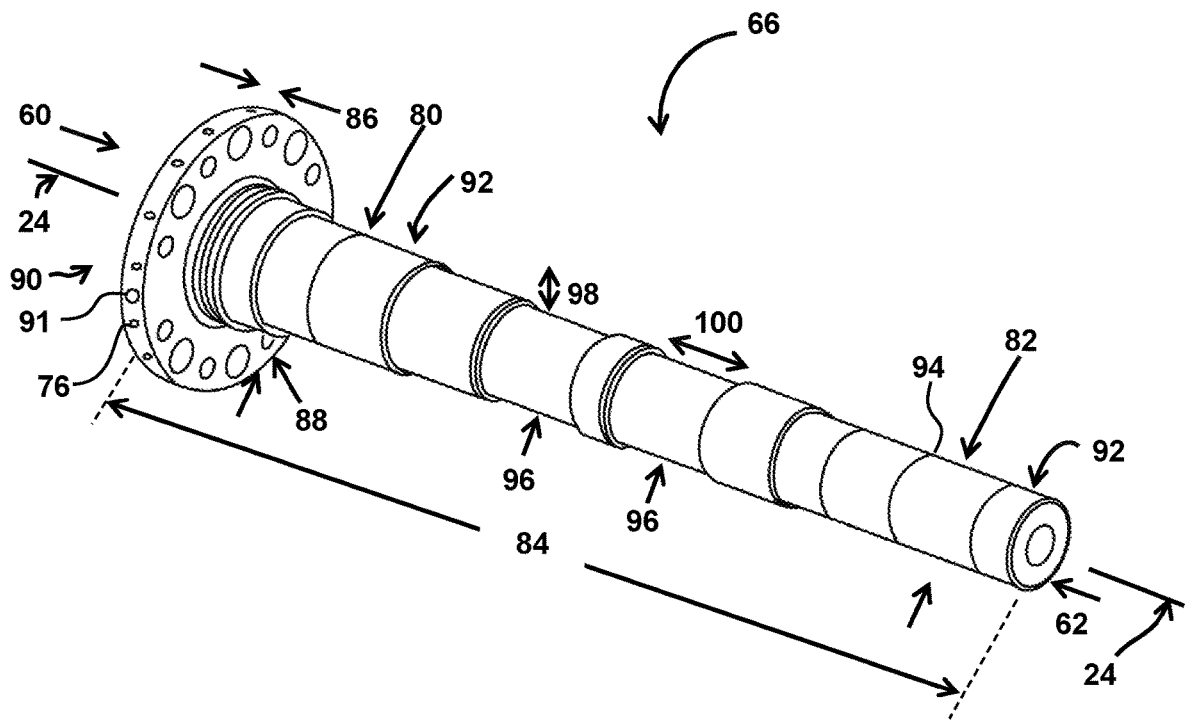
FIG. 5 illustrates a shaft of the spindle.

As described above, shaft 66 may extend from at or near first end 60 to at or near second end 62 of spindle 18 along first axis 24. Shaft 66 is illustrated in FIG. 5. In some embodiments, shaft 66 may be formed from machine steel 4340, other machine steels like A2, 4140, 01, SS304, and/or other materials. As shown in FIG. 5, shaft 66 may have a larger diameter 80 toward first end 60 compared to the diameter 82 of shaft 66 toward second end 62. Diameters 80 and 82 may be configured to withstand a radial load from belts 64 (FIG. 3), torque induced by load motors 16 (FIG. 1) and/or the device under test, and/or other mechanical loads. In some embodiments, diameter 80 may be up to about 80 mm. In some embodiments, diameter 80 may be between about 40 mm and 60 mm. In some embodiments, diameter 80 may be about 50 mm. In some embodiments, diameter 82 may be up to about 60 mm. In some embodiments, diameter 82 may be between about 30 mm and 50 mm. In some embodiments, diameter 82 may be about 40 mm. Shaft 66 may have an overall length 84 configured to facilitate high rotational speeds substantially without resonance. In some embodiments, length 84 may be the shortest length that allows system 10 (FIG. 1) to function as described herein. In some embodiments, length 84 may be between about 450 mm and 460 mm. In some embodiments, length 84 may be about 456 mm. In some embodiments, shaft 66 may have a length between bearings 68 and 70 between about 310 mm and 320 mm. In some embodiments, the length between bearings 68 and 70 is about 316 mm. It should be noted that the dimensions and materials associated with shaft 66 and the other components described herein are not intended to be limiting. Shaft 66 and the other components described herein may be made from any materials and have any dimensions that allow shaft 66, the other components described herein, and system 10 as a whole, to function as described. For example, any of the materials and/or dimensions described herein may be adjusted and/or scaled for applications in different industries, etc.

Shaft 66 may comprise flange 76 and/or other components at or near first end 60. Flange 76 may be configured to couple with, or facilitate coupling with a device under test. Flange 76 may be configured to receive a torque sensor and/or other components and facilitate coupling of spindle 18 (FIG. 1) with the device under test. In some embodiments, flange 76 is first bolted to a torque sensor, then this combination is bolted to a female splined flange. Flange 76 may have a thickness 86 and/or a diameter 88 configured to facilitate coupling with the device under test, the torque sensor, and/or other components. In some embodiments, thickness 86 is up to about 20 mm. In some embodiments, thickness 86 is between about 10 mm and 15 mm. In some embodiments, thickness 86 is about 12 mm. In some embodiments, diameter 88 is up to about 130 mm. In some embodiments, diameter 88 is between about 120 mm and 125 mm. In some embodiments, diameter 88 is about 121 mm. In some embodiments, diameter 88 may be sized to reduce the overall mass of the flange and enhance rotational speed of shaft 66. In some embodiments, flange 76 includes one or more hole patterns 90 (e.g., through thickness 86, along an edge surface 91, etc.) configured to facilitate coupling with the device under test, reduce mass of shaft 66, enhance rotational speed, and/or for other purposes. In some embodiments, shaft 66 may be configured such that a distance from flange 76 to a location at or near first bearing 68 (FIG. 3, FIG. 4) is minimized to reduce overhang and vibration of shaft 66.

In some embodiments, shaft 66 may comprise labyrinth grooves 92. Labyrinth grooves 92 may be formed around a circumference 94 of shaft 66 and/or in other locations. Labyrinth grooves 92 may be located proximate to bearings 68 and 70 (FIG. 3 and FIG. 4). Labyrinth grooves 92 may be configured to prevent or reduce contamination in bearings 68 and 70. Labyrinth grooves 92 may be located on at or near an inside edge of bearing 68 and bearing 70 relative to first end 60 and second end 24, for example. Spindle housing 46 (FIG. 3, FIG. 4) and/or other components of spindle 18 (FIG. 3, FIG. 4) may include corresponding projections that engage labyrinth grooves 92 to keep contamination from reaching bearing 68 or bearing 70.

In some embodiments, shaft 66 may comprise one or more cooling channels 96 located proximate to sprocket 67 (FIG. 3 and FIG. 4). FIG. 5 illustrates two cooling channels 96, for example. Cooling channels 96 may be configured to facilitate airflow that cools shaft 66, sprocket 67, belts 64 (FIG. 3), and/or other components of spindle 18. Cooling channels 96 may be formed as depressions in shaft 66 around circumference 94 of shaft 66, for example. In some embodiments, the depressions may have a depth 98 of up to about 3 mm. In some embodiments, the depressions may have a depth of between 1 mm and 3 mm. In some embodiments, the depressions may have a depth of about 2 mm. In some embodiments, the depressions may have a width 100 of up to about 60 mm. In some embodiments, width 100 may be between about 50 mm and about 55 mm. In some embodiments, width 100 may be about 52 mm. The dimensions of cooling channels 96 may be configured to facilitate the cooling described above without substantially affecting the ability of shaft 66 to withstand the forces from belts 64, motors 16, the device under test, or other components. The dimensions of cooling channels 96 may be configured to facilitate the cooling described above without substantially affecting the ability of shaft 66 to rotate at high speeds.

Figure 6:
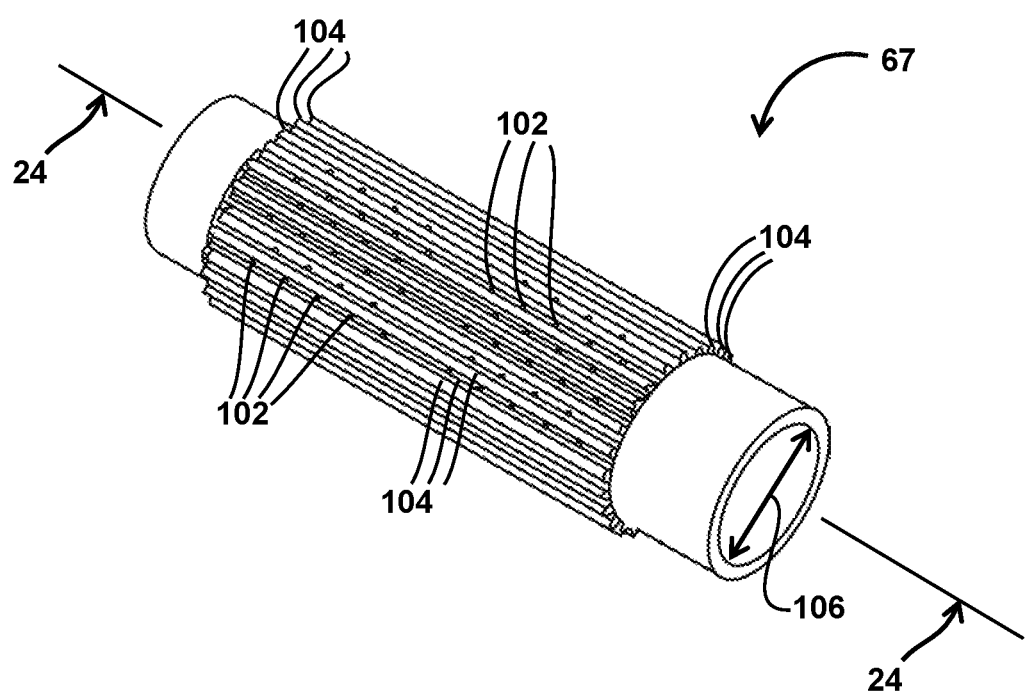
FIG. 6 illustrates a sprocket configured to be coupled to the shaft of the spindle.

Sprocket 67 is illustrated in FIG. 6. Sprocket 67 may be configured to be coupled to shaft 66 (FIG. 5) between first end 60 (FIG. 5) and second end 62 (FIG. 5). Sprocket 67 may be configured to be coupled to shaft 66 at or near cooling channels 96 (FIG. 5), for example, between locking rings 78 and 79 shown in FIG. 3 and FIG. 4. Sprocket 67 may be configured to receive one or more belts 64 (FIG. 3) coupled to the one or more load motors 16 (FIG. 1 and FIG. 2). Sprocket 67 may be configured to receive one or more belts 64 (FIG. 3) coupled to the one or more load motors 16 such that shaft 66 is driven by the one or more belts 64 to turn spindle 18 (FIG. 1-4) and load the device under test (e.g., as described herein). In some embodiments, sprocket 67 may include one or more holes 102 (e.g., a hole pattern) between individual sprocket teeth 104. Holes 102 may be configured to facilitate the airflow (e.g., in conjunction with cooling channels 95 (FIG. 5) that cools shaft 66, sprocket 67, belts 64 (FIG. 3), and/or other components of spindle 18. In some embodiments, sprocket 67 forms a tube having an inside diameter 106 sized to facilitate engagement between sprocket shaft 66 (FIG. 5). Locking rings 78 and 79 squeeze sprocket 67 onto shaft 66 and hold them together. Locking rings 78 and 79 are sized to withstand the torque required in the system. Sprocket 67 is configured to be used with a timing belt. As a source for a transmission, this is suitable since torque reversals anticipated during testing will cause little to no premature wear, unlike with a gearbox.

Returning to FIG. 3 and FIG. 4, bearings 68 and 70 may be configured to facilitate rotation of shaft 66. As described above, first bearing 68 may be coupled to shaft 66 toward first end 60. Second bearing 70 may be coupled to shaft 66 toward second end 62. In some embodiments, bearings 68 and 70 may be and/or include angular contact ball bearings, for example, or other bearings. In some embodiments, first bearing 68 may have a larger diameter than second bearing 70. In some embodiments, the diameters of bearings 68 and 70 correspond to the diameter of shaft 66 at or near the locations where bearings 68 and 70 are configured to couple with shaft 66. For example, as described above, the diameter of shaft 66 may be larger toward first end 60 compared to second end 62. The diameters of bearings 68 and 70 may correspond to these diameters of shaft 66. Bearing 68 may be selected based on a smallest possible diameter of shaft 66 to facilitate maximum speed from bearing 68. The smaller diameter of bearing 70 may facilitate higher speeds and ease manufacturing, since the torque at that point on shaft 66 is comparatively lower.

In some embodiments, bearings 68 and/or 70 may be configured to couple with temperature sensors 74 and/or other sensors. Temperature sensors 74 may be configured to generate output signals conveying information related to temperatures of bearings 68 and/or 70. The information related to temperatures of bearings 68 and/70 may be used to determine whether spindle 18 is at risk of overheating, for example, and/or for other reasons. In some embodiments, bearings 68 and/or 70 may be configured to couple with temperature sensors 74 via channels 110 formed in spindle housing 46. A channel 110 may extend through spindle housing 46 to a location at or near bearing 68 and/or 70. Channel 110 may be configured to receive a probe of a temperature sensor 74 and conduct the probe to the location at or near bearing 68 and/or 70 such that the probe generates information related to the temperature of bearing 68 and/or 70.

As described above, lubrication jets 72 may be located proximate to bearings 68 and 70. Lubrication jets 72 may be configured to apply lubricant to bearings 68 and/or 70 to cool bearings 68 and/or 70, shaft 66, and/or other components of system 10. In some embodiments, lubrication jets 72 may be and/or include channels 112 formed in spindle housing 46. A channel 112 may extend through spindle housing 46 to a location at or near bearing 68 and/or 70. Channel 112 may be configured to receive lubricant and/or a device configured to eject lubricant and conduct the lubricant and/or the device to the location at or near bearing 68 and/or 70 such that the lubricant is applied to bearings 68 and/or 70.

Figure 7:
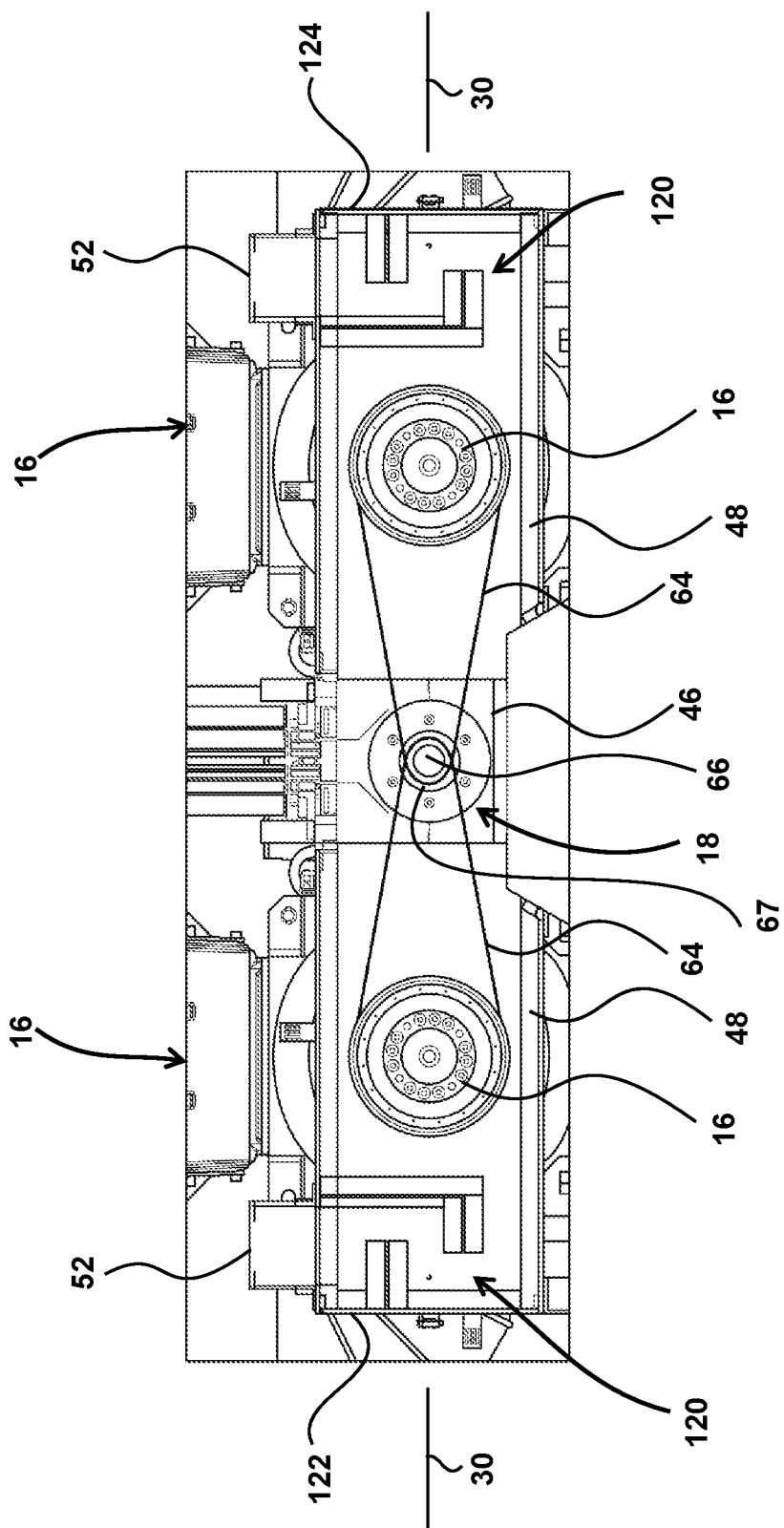
FIG. 7 illustrates a cross sectional view of two belts coupled to corresponding load motors such that the shaft of the spindle is driven by the belts to turn the spindle.

As described above, one or more belts 64 may be coupled to one or more load motors 16 (shown in FIGS. 1 and 2) such that shaft 66 of spindle 18 is driven by the one or more belts 64 to turn spindle 18 and load the device under test. FIG. 7 illustrates a cross sectional view of two belts 64 coupled to corresponding load motors 16 such that shaft 66 of spindle 18 is driven by belts 64 to turn spindle 18. As shown in FIG. 7, load motors 16 may engage belted transmission 14 via belts 64 housed in belt housings 48. Belts 64 may be generally positioned along second axis 30, for example. In some embodiments, sprocket 67 may be configured to receive a first belt 64 coupled to a first load motor 16, and a second belt 64 coupled to a second load motor 16 such that shaft 66 may be driven by either or both belts 64 and motors 16 to turn spindle 18 and load the device under test.

Belts 64 and at least a portion of spindle 18 may be enclosed with a housing of belted transmission 14. As described above, in some embodiments, the housing may comprise a spindle housing 46 and a belt housing 48. In some embodiments, belt housing 48 may comprise different portions configured to enclose the different belts 64. The different portions may be located on either side of spindle housing 46 along second axis 30, for example. Belt housing 48 is shown as separate rectangular boxes in FIG. 7 (and other figures). This is not intended to be limiting. Belt housing 48 may have any shape that allows it to enclose belts 64 and otherwise function as described herein.

In some embodiments, the different portions of belt housing 48 may individually comprise serpentine air exhaust paths 120 configured to exhaust air from belt housing 48 and absorb noise produced by rotating belts 64 and/or other portions of the system. In some embodiments, serpentine air paths 120 may be located at ends 122 and 124 of belt housing 48 along second axis 30 away from spindle 18. Serpentine air paths 110 may be configured to increase a length of an exhaust pathway and a corresponding surface area of belt housing 48 along serpentine air paths 120 such that belt housing 48 absorbs sound waves as air is exhausted from system 10 (FIG. 1). In some embodiments, serpentine air paths 120 may be formed by one or more materials configured to absorb sound waves and/or other materials.

Figure 8A:
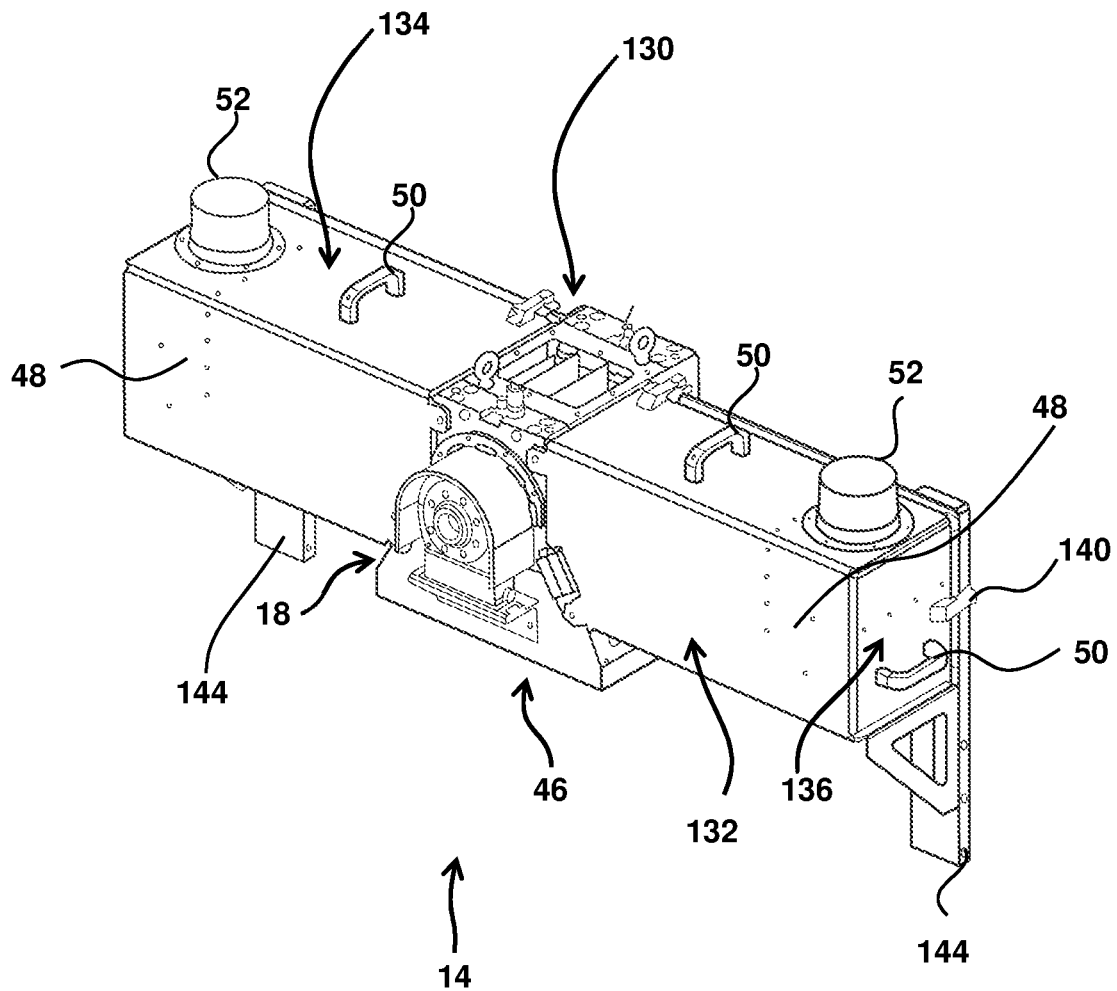
FIG. 8A illustrates a first view of external surfaces of the spindle housing and a belt housing.
Figure 8A:
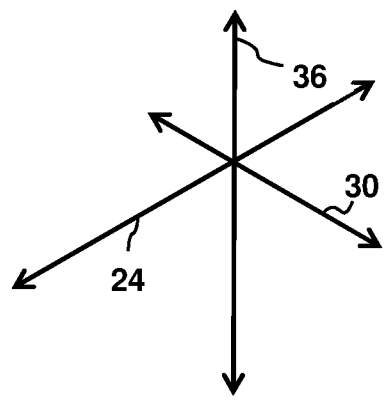
Figure 8B:
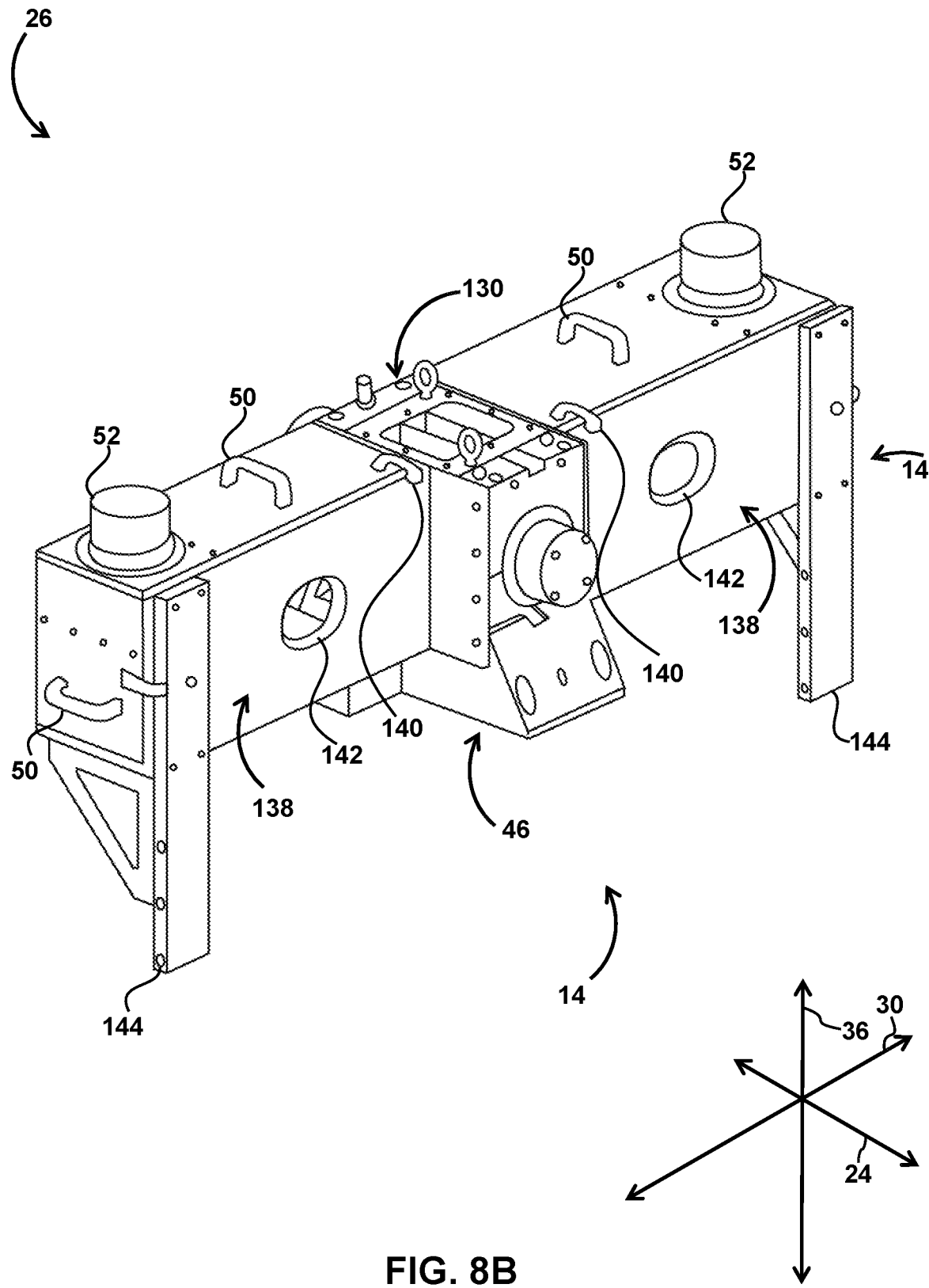
FIG. 8B illustrates a second view of external surfaces of the spindle housing and the belt housing.

FIG. 8A and FIG. 8B illustrate external surfaces 130 of spindle housing 46 and external surfaces 132, 134, 136, and 138 of belt housing 48. Belted transmission 14 may include spindle 18 and a spindle housing 46 generally oriented along first axis 24, belt housings 48 generally oriented along second axis 30, and/or other components. Belt housings 48 are positioned proximate to, and on either side of spindle 18 and spindle housing 46 along second axis 30. Belt housings 48 may include handles 50, exhaust ports 52, and/or other features on various surfaces 132, 134, 136 and/or 138 of belt housings 48. For example, belt housings 48 may include coupling devices 140 configured to removably couple one or more surfaces 132, 134, 136, and/or 148 to each other. Coupling devices 140 may include clips, clamps, magnets, screws, and/or other coupling devices. Coupling devices 140 may facilitate removal of one or more surfaces 132, 134, 136, and/or 148 to provide access to an interior of belt housings 48 (e.g., as shown in FIG. 7). FIG. 8a illustrates a view of spindle housing 46 and belt housing 48 from first end 26. FIG. 8b illustrates a view of spindle housing 46 and belt housing 48 from an opposite end. As shown in FIG. 8a, surfaces 132 and 134 may be generally oriented along second axis 30, and surfaces 136 may be generally oriented along third axis 36. As shown in FIG. 8b, surfaces 138 may be oriented generally along second axis 30. FIG. 8b illustrates one or more orifices 142 provided in surfaces 138 (though orifices 142 may be provided in any of the surfaces 132-138) configured to facilitate airflow through belt housings 48 and/or other effects. FIG. 8b also illustrates structural components 144 configured to facilitate coupling of belted transmission 14 to one or more other components of system 10 (e.g., as shown in FIG. 1). FIGS. 8a and 8b illustrate surfaces 132-138 coupled to each other at approximately right angles so that belt housings 48 have rectangular cross sections. This is not intended to be limiting. Belt housings 48 may have any cross section that allows them to function as described herein.

Figure 9:
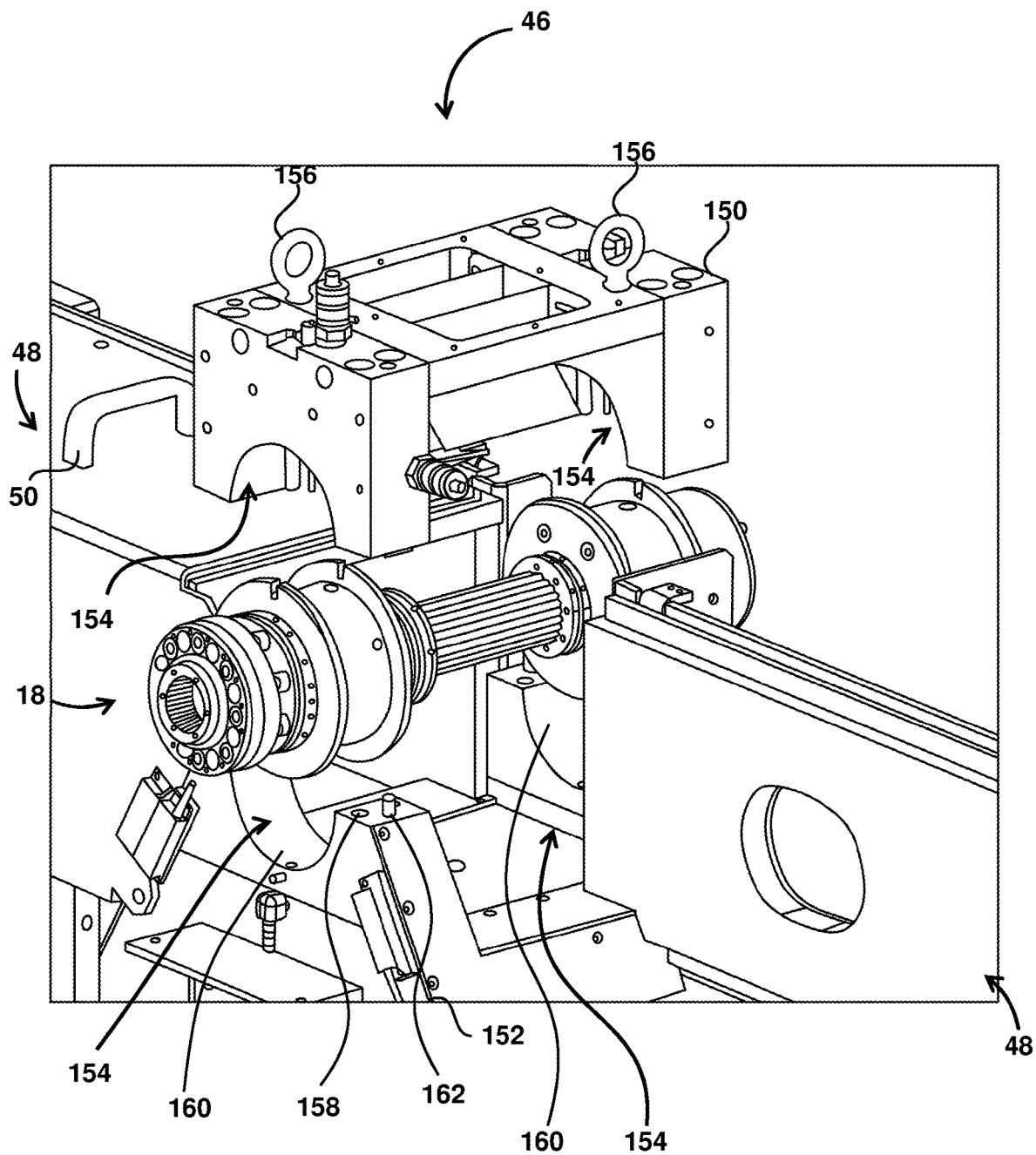
FIG. 9 illustrates the spindle housing comprising two separable pieces configured to separate to facilitate access to and adjustment of the spindle by a user.

In some embodiments, spindle housing 46 may comprise two or more separable pieces configured to separate to facilitate access to and adjustment of spindle 18 by a user. FIG. 9 illustrates spindle housing 46 comprising two separable pieces 150 and 152 configured to separate to facilitate access to and adjustment of spindle 18 by a user. In some embodiments, pieces 150 and 152 have portions 154 with shapes that generally correspond to corresponding sections of spindle 18. In some embodiments, FIG. 9 illustrates piece 150 may comprising an upper portion and piece 152 comprising a lower portion of spindle housing 46. It should be noted that the terms "upper" and "lower" are not intended to be limiting. Spindle housing 46 may be split into any pieces that allow it to function as described herein. Piece 150 may include attachment rings 156 and/or other features configured to facilitate separation of piece 150 from piece 152, coupling with other components of system 10 (FIG. 1) or other systems, and/or configured to facilitate other operations. Piece 152 may include support surfaces 158, alignment surfaces 160, and/or other features configured to facilitate alignment and/or coupling with spindle 18 and/or piece 150. In some embodiments, support surfaces 158 may include and/or be configured to receive and/or couple with alignment features 162 (e.g., pegs as shown in FIG. 9) configured to engage corresponding orifices (not visible in FIG. 9) and/or other features on piece 150 to guide the coupling of piece 150 to piece 152. As shown in FIG. 9, spindle 18 is designed as a cartridge that may be lifted out of the separated housing, and does not require substantial realignment when replaced back to its original position. This interchangeability facilitates changing the ratio for the dyno (dynamometer). This design facilitates different speed torque curves for a given power on a dyno. As described herein a two portion spindle housing facilitates quick swapping of spindle 66. The figures and corresponding paragraphs above describe a spindle with a specified sprocket diameter. This sprocket diameter defines the ratio. If a different spindle was provided with a larger sprocket then the ratio would be changed and the dyno will be able to test devices under test with higher torques, and lower speeds. This interchangeability is powerful because it means that one dyno with two spindles can cover a very broad spectrum of torque and speed curves for a given power.

Returning to FIG. 1, motors 16 may be standard industrial motors and/or other motors. Motors 16 may be typical motors that may be included on or with a test stand that is similar to and/or the same as test stand 12. In some embodiments, motors 16 may individually or together with belted transmission 14 be configured to produce speeds up to and above 25,000 RPM, with 1000 Nm of torque, even in load systems of up to 500 kW (these specifications are examples and not intended to be limiting). As described herein, the present system is designed so that the motors are interchangeable and no specific motor make or model is required. However, one example of motors that may be used in the present system include 225 frame induction motors from T-T Electric.

Figure 10:
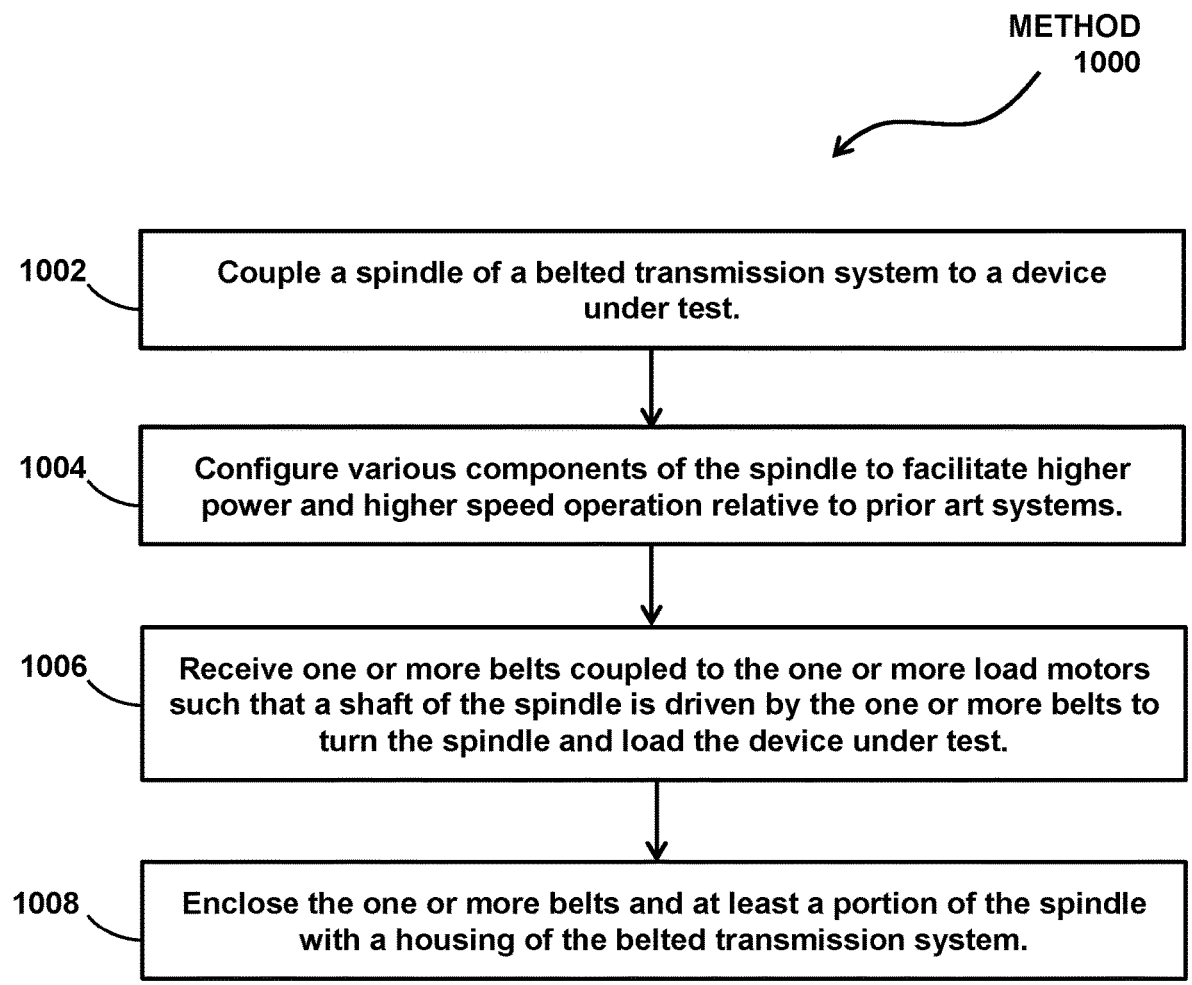
FIG. 10 illustrates a method for providing a load to a device under test with a belted transmission system and/or other components.

FIG. 10 illustrates a method 1000 for providing a load to a device under test with a belted transmission system and/or other components. The operations of method 1000 presented below are intended to be illustrative. In some embodiments, method 1000 may be accomplished with one or more additional operations not described, and/or without one or more of the operations discussed. Additionally, the order in which the operations of method 1000 are illustrated in FIG. 10 and described below is not intended to be limiting.

At an operation 1002, a spindle of a belted transmission system may be coupled to a device under test. The belted transmission system may be used in a test stand and configured to couple with one or more load motors to provide a load to the device under test. The spindle may have a first end configured to couple with the device under test and a second opposite end, and/or other components. In some embodiments, operation 1002 may be performed by a spindle that is the same as or similar to spindle 18 (shown in FIG. 1 and described herein).

At an operation 1004, various components of the spindle may be configured to facilitate higher power and higher speed operation of the belted transmission system relative to prior art systems. For example, the spindle may comprise a shaft extending from the first end to the second end of the spindle. The shaft may have a larger diameter at the first end compared to the second end. The shaft may comprise a flange and/or other components at the first end. The flange may be configured to receive a torque sensor and/or other components and facilitate coupling of the spindle with the device under test. In some embodiments, the shaft may comprise labyrinth grooves formed in a circumference of the shaft located proximate to one or more bearings. The grooves may be configured to prevent or reduce contamination in one or more bearings coupled to the shaft, for example.

The one or more bearings may be configured to facilitate rotation of the shaft. In some embodiments, the one or more bearings may comprise two bearings. A first bearing of the two bearings may be coupled to the shaft toward the first end. A second bearing of the two bearings may be coupled to the shaft toward the second end. In some embodiments, the first bearing may have a larger diameter than the second bearing. In some embodiments, the one or more bearings may be configured to couple with one or more temperature and/or other sensors. The one or more temperature sensors may be configured to generate output signals conveying information related to temperatures of the one or more bearings. The information related to temperatures of the one or more bearings may be used to determine whether the spindle is at risk of overheating, for example. In some embodiments, the spindle may include one or more lubrication jets located proximate to the one or more bearings. The one or more lubrication jets may be configured to apply lubricant to the one or more bearings to cool the one or more bearings, the shaft, and/or other components of the system.

The spindle may comprise a sprocket coupled to the shaft between the first end and the second end. The sprocket may be configured to receive one or more belts coupled to the one or more load motors such that the shaft is driven by the one or more belts to turn the spindle and load the device under test (e.g., as described herein). In some embodiments, the shaft may comprise one or more cooling channels located proximate to the sprocket. The one or more cooling channels may be configured to facilitate airflow that cools the shaft, the sprocket, and the one or more belts. The one or more cooling channels may be formed as depressions in the shaft around a circumference of the shaft, for example. In some embodiments, operation 1004 may be performed by components of a spindle the same as or similar to the components of spindle 18 (shown in FIG. 1 and described herein).

At an operation 1006, one or more belts may be coupled to one or more load motors such that a shaft of the spindle is driven by the one or more belts to turn the spindle and load the device under test. In some embodiments, the one or more load motors comprise two load motors, and the sprocket (described above) is configured to receive a first belt coupled to a first load motor of the two load motors, and a second belt coupled to a second load motor of the two load motors such that the shaft is driven by the first belt and the second belt to turn the spindle and load the device under test. In some embodiments, operation 1006 may be performed by one or more belts that are the same as or similar to belts 64 (shown in FIG. 3 and FIG. 7, and described herein).

At an operation 1008, the one or more belts and at least a portion of the spindle are enclosed with a housing of the belted transmission system. In some embodiments, the housing may comprise a spindle housing and a belt housing. In some embodiments, the spindle housing may comprise two or more separable pieces configured to facilitate access to and adjustment of the spindle by a user and allows the ability to easily change the transmission ratio of the dyno. In some embodiments, the belt housing may comprise a serpentine air exhaust path configured to exhaust air from the system and absorb noise produced by the system. In some embodiments, operation 1008 may be performed by a housing that is the same as or similar to spindle housing 46 and/or belt housing 48 (shown in FIG. 1 and described herein).

Although the disclosure has been described in detail for the purpose of illustration based on what is currently considered to be the most practical and preferred embodiments, it is to be understood that such detail is solely for that purpose and that the disclosure is not limited to the disclosed embodiments, but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment.

What is claimed is:

1. A belted transmission system configured to couple with one or more load motors to provide a load to a device under test, the belted transmission system comprising:
    a spindle having a first end configured to couple with the device under test and a second opposite end, the spindle comprising:
        a shaft extending from the first end to the second end, the shaft having a larger diameter at the first end compared to the second end;
        one or more bearings configured to facilitate rotation of the shaft; and
        a sprocket coupled to the shaft between the first end and the second end, the sprocket configured to receive one or more belts coupled to the one or more load motors such that the shaft is driven by the one or more belts to turn the spindle and load the device under test; and
    a housing configured to enclose the one or more belts and at least a portion of the spindle.

2. The system of claim 1, wherein the one or more load motors comprise two load motors, and the sprocket is configured to receive a first belt coupled to a first load motor of the two load motors, and a second belt coupled to a second load motor of the two load motors such that the shaft is driven by the first belt and the second belt to turn the spindle and load the device under test.

3. The system of claim 1, wherein the one or more bearings comprise two bearings, wherein a first bearing of the two bearings is coupled to the shaft toward the first end, wherein a second bearing of the two bearings is coupled to the shaft toward the second end, and wherein the first bearing has a larger diameter than the second bearing.

4. The system of claim 1, wherein in the shaft comprises labyrinth grooves formed in a circumference of the shaft located proximate to the one or more bearings, the grooves configured to prevent or reduce contamination in the one or more bearings.

5. The system of claim 1, wherein the shaft comprises one or more cooling channels located proximate to the sprocket, the one or more cooling channels configured to facilitate airflow that cools the shaft, the sprocket, and the one or more belts.

6. The system of claim 5, wherein the one or more cooling channels are formed as depressions in the shaft around a circumference of the shaft.

7. The system of claim 1, wherein the shaft comprises a flange at the first end, the flange configured to receive a torque sensor and facilitate coupling of the spindle with the device under test.

8. The system of claim 1, wherein the one or more bearings are configured to couple with one or more corresponding temperature sensors, the one or more corresponding temperature sensors configured to generate output signals conveying information related to temperatures of the one or more bearings, the information related to temperatures of the one or more bearings used to determine whether the spindle is at risk of overheating.

9. The system of claim 1, further comprising one or more lubrication jets located proximate to the one or more bearings, the one or more lubrication jets configured to apply lubricant to the one or more bearings to cool the one or more bearings.

10. The system of claim 1, wherein the housing comprises a spindle housing and a belt housing, wherein:
    the spindle housing comprises two or more separable pieces configured to facilitate access to and adjustment of the spindle by a user; and
    the belt housing comprises a serpentine air exhaust path configured to exhaust air from the system and absorb noise produced by the system.

11. A load motor system used in a test stand to provide a load to a device under test, the system comprising:
    a first load motor configured to drive the device under test;
    a second load motor configured to drive the device under test; and
    a belted transmission configured to couple with the first and second load motors and provide the load to the device under test, the belted transmission comprising:
        a spindle having a first end configured to couple with the device under test and a second opposite end, the spindle comprising a shaft extending from the first end to the second end, the shaft having a larger diameter at the first end compared to the second end;
        a first belt configured to be received by the shaft and coupled to the first load motor;
        a second belt configured to be received by the shaft and coupled to the second load motor such that the shaft is driven by the first and second belts to turn the spindle and load the device under test; and
        a housing configured to enclose the first belt, the second belt, and at least a portion of the spindle, and facilitate mounting of the belted transmission to the test stand.

12. The system of claim 11, wherein in the shaft comprises labyrinth grooves formed in a circumference of the shaft located proximate to one or more bearings coupled with the shaft, the grooves configured to prevent or reduce contamination in the one or more bearings.

13. The system of claim 11, wherein the shaft comprises one or more cooling channels, the one or more cooling channels configured to facilitate airflow that cools the shaft and the belts.

14. The system of claim 11, wherein the shaft comprises a flange at the first end, and the system further comprises a torque sensor, the flange configured to receive the torque sensor and facilitate coupling of the spindle with the device under test.

15. The system of claim 11, wherein the system further comprises one or more temperature sensors and one or more bearings configured to couple with the one or more temperature sensors, the one or more bearings configured to facilitate rotation of the shaft, the one or more temperature sensors configured to generate output signals conveying information related to temperatures of the one or more bearings, the information related to temperatures of the one or more bearings used to determine whether the spindle is at risk of overheating.

16. A method for providing a load to a device under test with a belted transmission system, the belted transmission system configured to couple with one or more load motors, the belted transmission system comprising a spindle and a housing, the method comprising:

coupling a first end of the spindle with the device under test:

forming a shaft of the spindle with a larger diameter at a first end of the spindle relative to the second end;

facilitating rotation of the shaft with one or more bearings of the spindle;

coupling a sprocket to the shaft;

receiving, with the sprocket, one or more belts coupled to the one or more load motors such that the shaft is driven by the one or more belts to turn the spindle and load the device under test; and enclosing the one or more belts and at least a portion of the spindle with a housing of the belted transmission system.

17. The method of claim 16, wherein the one or more load motors comprise two load motors, and the method comprises receiving, with the sprocket, a first belt coupled to a first load motor of the two load motors, and a second belt coupled to a second load motor of the two load motors, and driving the shaft with the first belt and the second belt to turn the spindle and load the device under test.

18. The method of claim 16, further comprising generating, with a torque sensor of the belted transmission system, output signals conveying information related to an amount of torque generated by the belted transmission system.

19. The method of claim 16, further comprising generating, with one or more temperature sensors of the belted transmission system, output signals conveying information related to temperatures of one or more bearings coupled to the shaft, the information related to temperatures of the one or more bearings used to determine whether the spindle is at risk of overheating.

20. The method of claim 16, further comprising loading the device under test without a gearbox.

* * * * *